(12) United States Patent
Wang et al.

(10) Patent No.: US 6,710,452 B1
(45) Date of Patent: Mar. 23, 2004

(54) COHERENT DIFFUSION BARRIERS FOR INTEGRATED CIRCUIT INTERCONNECTS

(75) Inventors: Pin-Chin Connie Wang, Menlo Park, CA (US); Matthew S. Buynoski, Palo Alto, CA (US); Suzette K. Pangrle, Cupertino, CA (US); Amit P. Marathe, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 17 days.

(21) Appl. No.: 09/618,964

(22) Filed: Jul. 19, 2000

(51) Int. Cl.⁷ .......................... H01L 23/48; H01L 23/52
(52) U.S. Cl. .................. 257/762; 257/751; 257/760; 257/761
(58) Field of Search ...................... 257/751, 752, 257/753, 758, 760, 761, 762, 768, 767, 769; 438/643, 648, 656, 683, 685, 687

(56) References Cited

U.S. PATENT DOCUMENTS

| | | | | |
|---|---|---|---|---|
| 5,793,113 A | * | 8/1998 | Oda | 257/774 |
| 5,985,759 A | * | 11/1999 | Kim et al. | 438/653 |
| 6,229,211 B1 | * | 5/2001 | Kawaqnoue et al. | 257/751 |
| 6,348,731 B1 | * | 2/2002 | Ashley et al. | 257/751 |
| 6,376,370 B1 | * | 4/2002 | Farrar | 438/678 |

* cited by examiner

Primary Examiner—Hung Vu
(74) Attorney, Agent, or Firm—Mikio Ishimaru

(57) ABSTRACT

An integrated circuit and manufacturing method therefor is provided having a semiconductor substrate with a semiconductor device and a device dielectric layer formed on the semiconductor substrate. A channel dielectric layer on the device dielectric layer has a channel opening, a barrier layer lining the channel opening, and a conductor core filling the channel opening. The barrier layer has a more negative heat of formation than the channel dielectric layer whereby the barrier layer is reacts with and forms a barrier to diffusion of the material of the conductor core to the channel dielectric layer. The barrier layer also forms a stable compound with the conductor core to form a coherent barrier layer bonding the channel dielectric to the conductor core.

19 Claims, 2 Drawing Sheets

COHERENT DIFFUSION BARRIERS FOR INTEGRATED CIRCUIT INTERCONNECTS

TECHNICAL FIELD

The present invention relates generally to semiconductors and more specifically to diffusion barrier in semiconductor processing.

BACKGROUND ART

In the manufacture of integrated circuits, after the individual devices, such as the transistors, have been fabricated in the silicon substrate, they must be connected together to perform the desired circuit functions. This interconnection process is generally called "metallization", and is performed using a number of different photolithographic and deposition techniques.

In one interconnection process, which is called a "single inlaid" technique, channels of conductor material are deposited in a channel dielectric layer. The process starts with the placement of a first channel dielectric layer, which is typically an oxide layer, over the semiconductor devices. A first inlaid step photoresist is then placed over the oxide layer and is photolithographically processed to form the pattern of the first channels. An anisotropic oxide etch is then used to etch out the channel oxide layer to form the first channel openings. The inlaid step photoresist is stripped and an optional thin adhesion layer is deposited to coat the walls of the first channel opening to ensure good adhesion and electrical contact of subsequent layers to the underlying semiconductor devices. A barrier layer is then deposited on the adhesion layer improve the formation of subsequently deposited conductor material and to act as a barrier material to prevent diffusion of such conductor material into the oxide layer and the semiconductor devices. A first conductor material is then deposited and subjected to a chemical-mechanical polishing process which removes the first conductor material above the first channel oxide layer and inlays the first conductor material in the first channel openings to form the first channels.

In another interconnection process, which is called a "dual inlaid" technique, vias and channels are formed at the same time. The via formation step of the dual inlaid process starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate via areas over the first channels.

A nitride etch is then used to etch out the via areas in the via nitride. The via step photoresist is then removed, or stripped. A second channel dielectric layer, which is typically an oxide layer, is then deposited over the via nitride and the exposed oxide in the via area of the via nitride. A second inlaid step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The inlaid photoresist is then removed, and a nitride etch process removes the nitride above the first channels in the via areas. An adhesion layer is often deposited to coat the via openings and the second channel openings. Next, a barrier layer is deposited on the adhesion layer, and the two layers are collectively referred to as the barrier layer. This is followed by a deposition of the second conductor material in the second channel openings and the via openings to form the second channel and the via. A second chemical mechanical polishing process leaves the two vertically separated, horizontally perpendicular channels connected by vias.

The use of the single and dual inlaid techniques eliminate metal etch and dielectric gap fill steps typically used in the metallization process. The elimination of metal etch steps is important as the semiconductor industry moves from aluminum to other metallization materials, such as copper, which are very difficult to etch.

One drawback of using copper as the conductor material is that copper diffuses rapidly through various materials. Unlike aluminum, copper also diffuses through inter layer dielectric materials, such as silicon oxide. When copper diffuses through interlayer dielectric layers, it can cause leakage to neighboring interconnect lines on the semiconductor substrate. To prevent diffusion, highly diffusion resistive barrier materials, such as tantalum, titanium, tungsten, their nitrides, and combinations thereof, are used as barrier materials.

After deposition of the barrier layer, a seed layer of conductor material, such as copper, is deposited by an ion metal plasma (IMP) deposition, chemical vapor deposition (CVD), or an electroless plating process. This seed layer is subsequently used as one electrode in an electroplating process which deposits the conductor material which completely fills the channels and vias.

One problem is that current barrier materials typically are very high in resistance, which will defeat the purpose of using high conductivity materials, such as copper, which is desirable for high speed and good interconnections.

Another problem with current barrier materials is that the interface between barrier and the conductor material is not very strong, and this permits electromigration (EM) of conductor material to occur which results in void formation and reliability problems.

A solution to these problems has been long sought but has eluded those skilled in the art.

DISCLOSURE OF THE INVENTION

The present invention provides an integrated circuit having a semiconductor substrate with a semiconductor device and a device dielectric layer formed on the semiconductor substrate. A channel dielectric layer on the device dielectric layer has a channel opening, a barrier layer lining the channel opening, and a conductor core filling the channel opening. The barrier layer has a more negative heat of formation than the channel dielectric layer whereby the barrier layer reacts with and forms a barrier to diffusion of the material of the conductor core to the channel dielectric layer. With the more negative heat of formation, the barrier layer reacts with the dielectric layer to form a compound which provides a bond which blocks surface diffusion and permits conductor core to conductor core diffusion. This also causes the barrier layer to be self-aligning in the channel opening.

The present invention further provides a method for manufacturing an integrated circuit having a semiconductor substrate with a semiconductor device. A device dielectric layer is formed on the semiconductor substrate and a channel dielectric layer is formed on the device dielectric layer. A channel opening is formed in the channel dielectric layer, and a barrier layer is deposited to line the channel opening.

A conductor core is deposited to fill the channel opening. A barrier layer is deposited, having a more negative heat of formation than the channel dielectric layer, to cause the barrier layer to react with and form a barrier to diffusion of the material of the conductor core to the channel dielectric layer. With the more negative heat of formation, the barrier layer reacts with the dielectric layer to form a compound which provides a bond which blocks surface diffusion and permits conductor core to conductor core diffusion. This also allows the barrier layer deposition to be self-aligning in the channel opening.

The present invention provides an integrated circuit and method of manufacture which utilizes a material selected from a group consisting of a lanthanide series element, hafnium, zirconium, yttrium, calcium, strontium, barium, and a combination thereof, which provide self-aligned barrier layers, increase conductivity in equally sized channels over the prior art, and provide comparable diffusion resistance at thinner barrier thicknesses than the prior art.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
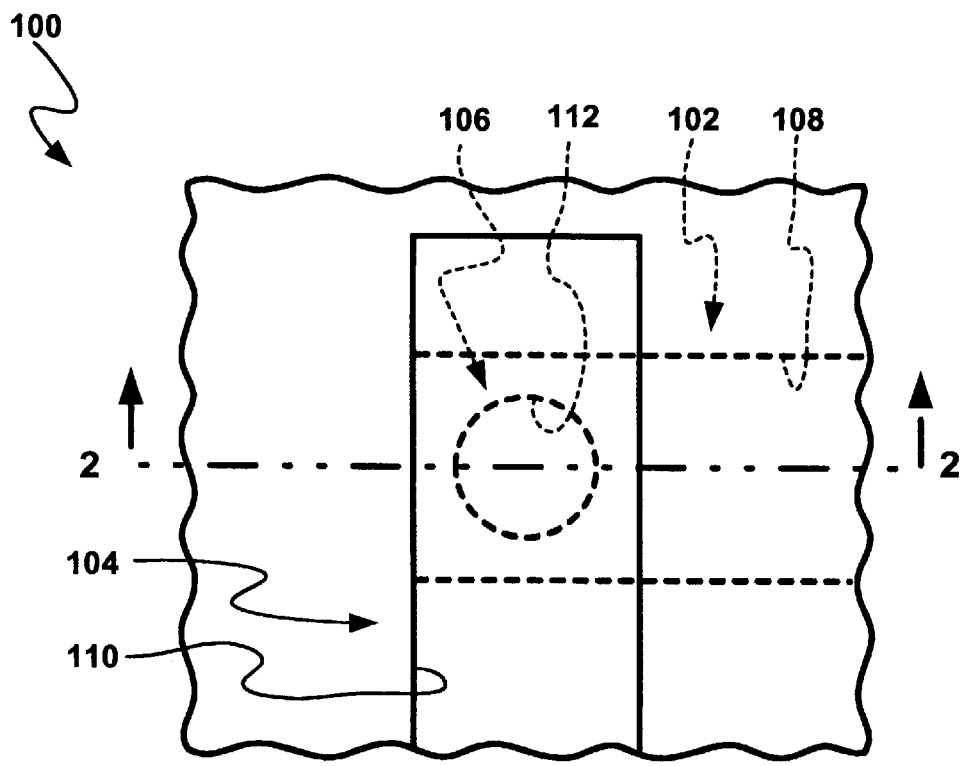
FIG. 1 (PRIOR ART) is a plan view of aligned channels with a connecting via.

Referring now to FIG. 1 (PRIOR ART), therein is shown a plan view of a semiconductor wafer 100 having as interconnects first and second channels 102 and 104 connected by a via 106. The first and second channels 102 and 104 are respectively disposed in first and second dielectric layers 108 and 1 10. The via 106 is an integral part of the second channel 104 and is disposed in a via dielectric layer 112. The dielectric layers herein can be of dielectric materials, such as silicon oxide, or low dielectric constant materials, such as benzocyclobutane (BCB), hydrogen silsesquioxane (HSQ), borophospho silicate glass (BPSG), etc.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
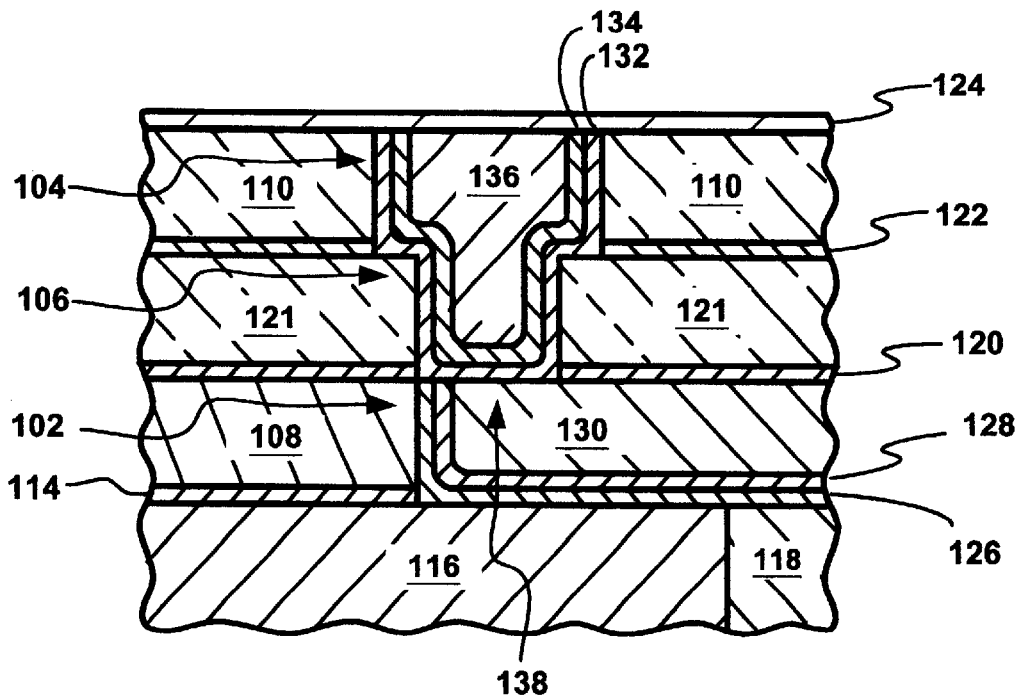
FIG. 2 (PRIOR ART) is a cross-section of FIG. 1 along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116. Generally, metal contacts (not shown) are formed in the device dielectric layer 116 to connect to an operative semiconductor device (not shown). This is represented by the contact of the first channel 102 with a semiconductor device gate 118 embedded in the device dielectric layer 116. The various layers above the device dielectric layer 116 are sequentially: the first channel stop layer 114, the first channel dielectric layer 108, a via stop layer 120, the via dielectric layer 121, a second channel stop layer 122, the second channel dielectric layer 110, and a next channel stop layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor material of the conductor cores 130 and 136 are deposited. The seed layers 128 and 134 are of substantially the same conductor material of the conductor cores 130 and 136 and become part of the respective conductor cores 130 and 136 after the deposition.

The deposition of the barrier layer 132 is such that it fills the bottom of the via 106 at barrier layer portion 138 so as to effectively separate the conductor cores 130 and 136.

In the past, for copper conductor material and seed layers, highly resistive diffusion barrier materials such as tantalum, titanium, tungsten, their nitrides, and combinations thereof are used as barrier materials to prevent diffusion. In addition to increasing the overall resistance of the semiconductor chip which contained all the semiconductor devices, the barrier region 138 would block diffusion of copper from the conductor core 130 to the conductor core 136 as electromigration caused the movement of copper atoms out of the via 106 and allowed the formation of voids therein. Further, the interface between the barrier materials and copper does not form a strong bond and creates weak points for electromigration to occur.

Thus, prior art combinations which included the various metal nitrides with copper were subject both to surface diffusion along the vias and channels and interface diffusion at the barrier region 138.

Figure 3:
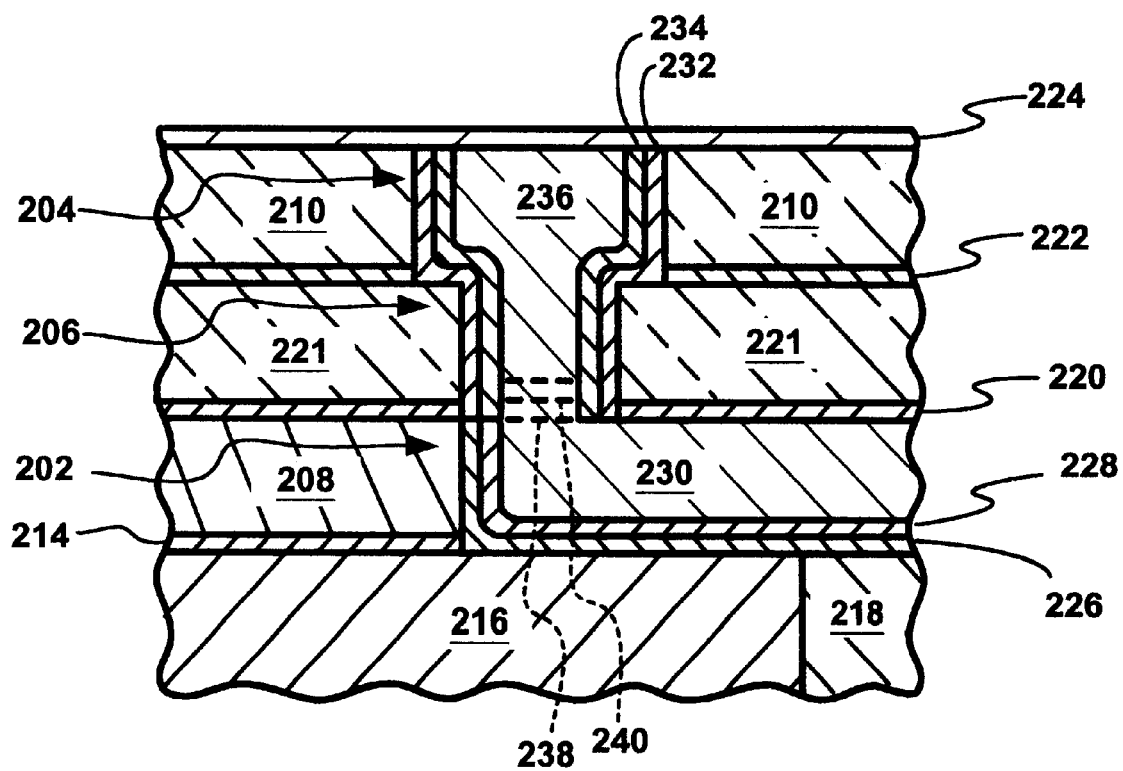
FIG. 3 is a cross-section similar to FIG. 2 (PRIOR ART) showing the channels and via according to the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second dielectric layers 208 and 210. The via 206 is a part of the second channel 204 and is disposed in a via dielectric layer 212.

A portion of the first channel 202 is disposed in a first channel stop layer 214 and is on a device dielectric layer 216. Generally, metal contacts (not shown) are formed in the device dielectric layer 216 to connect to an operative semiconductor device (not shown). This is represented by the contact of the first channel 202 with a semiconductor device gate 218 embedded in the device dielectric layer 216. The various layers above the device dielectric layer 216 are sequentially: the first channel stop layer 214, the first channel dielectric layer 208, a via stop layer 220, the via dielectric layer 221, a second channel stop layer 222, the second channel dielectric layer 210, and a next channel stop layer 224.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device. The seed layers 228 and 234 form electrodes on which the conductor material of the conductor cores 230 and 236 are deposited. The seed layers 228 and 234 are of substantially the same conductor material of the conductor cores 230 and 236 and become part of the respective conductor cores 230 and 236 after the deposition. The seed layers and conductor cores are of copper, copper-base alloys, gold, gold-base alloys, silver, silver-base alloys, and combinations thereof.

It will be noted the conductor cores 230 and 236 are integral in the present invention. As will hereinafter be explained, the barrier layer 232 forms a conductive intermetallic compound with the conductor material in a barrier material region 238. The seed layer 234 also is indistinguishable between the conductor cores 230 and 236 at a seed layer region 240.

In the present invention, a barrier material is used which has one or more of the following properties, without being limiting:

1. the heat of formation is more negative than the heat of formation of the dielectric material;
2. form a stable intermetallic compound with the conductor material;
3. coherent (or chemically similar) with both the dielectric material and the conductor material;
4. higher conductivity than titanium, tantalum, or tungsten; and/or
5. the atomic weight is larger than the atomic weight of the conductor material.

For the combination of oxide-based dielectric materials and copper conductor materials, materials from a group consisting of a lanthanide series element, hafnium, zirconium, yttrium, calcium, strontium, barium, and a combination thereof, without being limiting, have been been found to have a number of the desirable properties.

Lanthanum, for example, readily forms a metal oxide with the oxide in the oxided silicon (silicon oxide) dielectric material and also a stable intermetallic compound with copper. When lanthanum is deposited on silicon oxide, its very negative heat of formation compared to the heat of formation of silicon oxide causes it to closely bond to and reduce the silicon oxide to form lanthanum oxide ($La_2O_3$). Lanthanum oxide is a dense metal oxide, which prevents copper diffusion into the dielectric material. This preventative function is enhanced because lanthanum has a higher atomic weight than copper to slow free movement of copper atoms through it. It further has the property of forming compounds with copper, which means it is reactive with Cu and forms a very good interface with copper because it is chemically similar. This property reduces surface diffusion.

Thus, when placed onto a via or a trench, lanthanum basically reacts with both the dielectric material and the subsequently deposited copper to form a "coherent" bond, or a strong chemical bond, with both materials.

Lanthanum also has low solid solubility in copper, which means it is rejected from the copper grain during copper deposition, so the copper grain will be of a high purity and which will result in low resistance (compared to titanium, tantalum, and tungsten which are the prior art barrier metals).

In the present invention, the barrier layers 226 and 232 may be formed by a number of different methods. One method involves deposition of the metal barrier material to react with the dielectric, followed by deposition of the conductor material to form the intermetalllic compound. The deposition of the metallic barrier material will be to a thickness of between 10 Å to 100 Å.

Another method involves deposition of the metal barrier material as a percentage of the initial deposition of conductor material. It has been discovered that up to 4% of the conductor material can be the metallic barrier material.

Various processes such as physical vapor deposition, chemical vapor deposition, and/or electroplating deposition may be used.

As would be evident to those skilled in the art, a number of advantages accrue from the present invention.

One advantage is that the barrier layers 226 and 232 are self-aligned in that the barrier compound of the barrier material (the metal oxide) only forms where it is in contact with the dielectric oxide. As long as a solid layer of metal is not deposited, if the metal deposition is thin, it reacts with the barrier layers and forms discontinuous intermetallic compounds and, if is deposited as an alloy, the metal can diffuse away. In either event, metallic barrier material is not formed in the barrier region 238, so it does not block the diffusion of conductor material from the conductor core 230 to the conductor core 236. This helps prevent the formation of voids in the via 206.

Another advantage is that the barrier layers 226 and 232 can be very thin, under 100 Å, so the effective cross-sectional area of the via 206 is greater than for a conventional via which uses one of the high resistance materials.

Another advantage is that the coherent bonding forms strong chemical bonds which prevent surface diffusion of the conductor material.

As known to those skilled in the art, a higher negative heat of formation means that a reaction will occur during formation of the compound which will release energy as to a compound having a relatively lower negative value. A low energy state material is always more stable so will form before a high energy state material. The various heats of formation for reference purposes are:

La2O3=−539 kcal/mole
HfO2=−271 kcal/mole
ZrO2=−258 kcal/mole
CeO2=−235 kcal/mole
SiO2=−202 kcal/mole While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. An integrated circuit having a semiconductor substrate with a semiconductor device provided thereon, comprising:
    a device dielectric layer formed on the semiconductor substrate;
    a channel dielectric layer formed on the device dielectric layer having a channel opening provided therein;
    a conductor core filling the channel opening and connected to the semiconductor device; and
    a single barrier layer of conductor core material having a barrier metal spread throughout the conductor core material, the single barrier layer lining the channel opening under the conductor core, the single barrier layer having a more negative heat of formation than the channel dielectric layer whereby the barrier layer is bonded to the channel dielectric layer and to the conductor core and is a barrier to diffusion of the material of the conductor core to the channel dielectric layer.

2. The integrated circuit as claimed in claim 1 wherein the single barrier layer forms a stable compound with the material of the conductor core whereby a coherent bond is created.

3. The integrated circuit as claimed in claim 1 wherein the single barrier layer is of a material having a higher atomic weight than the material of the conductor core.

4. The integrated circuit as claimed in claim 1 wherein the single barrier layer is of a material having a solid solubility in the material of the conductor core whereby the barrier layer material is outside of grains of the conductor core material.

5. The integrated circuit as claimed in claim 1 including:
   a via dielectric layer formed over the channel dielectric layer and having a via opening provided therein open to the conductor core;
   a second channel dielectric layer formed over the via dielectric layer and having a second channel opening provided therein open to the via opening;
   a second conductor core filling the via and second channel openings; and
   a second barrier layer lining the via and second channel openings under the second conductor core, the second barrier layer is of a material forming a barrier between the second conductor core and the via and second channel dielectric layers and not forming a barrier between the conductor core and the second conductor core.

6. The integrated circuit as claimed in claim 1 wherein the single barrier layer contains a material selected from a group consisting of a lanthanide series element, hafnium, zirconium, yttrium, calcium, strontium, barium, and a combination thereof.

7. The integrated circuit as claimed in claim 1 wherein the single barrier layer is of a thickness between 10 Å to 100 Å.

8. An integrated circuit having a silicon substrate having a semiconductor device provided thereon, comprising:
   a device oxide layer formed on the silicon substrate;
   a channel oxide layer formed on the device oxide layer having a channel opening provided therein;
   a conductor core filling the channel opening and connected to the semiconductor device; and
   a single metallic barrier layer of conductor core material having a barrier metal spread throughout the conductor core material, the single barrier layer lining the channel opening under the conductor core, the single metallic barrier layer having a more negative heat of formation than the oxided material of the channel oxide layer whereby the single metallic barrier layer is a bonded metal oxide barrier to diffusion of the metal of the conductor core to the channel dielectric layer and is bonded to the metal of the conductor core.

9. The integrated circuit as claimed in claim 8 wherein the single metallic barrier layer forms a stable intermetallic compound with the metal of the conductor core whereby a coherent bond is created.

10. The integrated circuit as claimed in claim 8 wherein the single metallic barrier layer is of a metal having a higher atomic weight than the metal of the conductor core.

11. The integrated circuit as claimed in claim 8 wherein the single metallic barrier layer is of a metal having a solid solubility in the metal of the conductor core whereby the single metallic barrier layer metal is outside of grains of the conductor core metal.

12. The integrated circuit as claimed in claim 8, including:
   a via oxide layer formed over the channel oxide layer and having a via opening provided therein open to the conductor core;
   a second channel oxide layer formed over the via oxide layer and having a second channel opening provided therein open to the via opening;
   a second conductor core filling the via and second channel openings; and
   a second metallic barrier layer lining the via and second channel openings under the second conductor core, the second metallic barrier layer is of a metal forming a metallic barrier between the second conductor core and the via and second channel oxide layers and not forming a metallic barrier between the conductor core and the second conductor core.

13. The integrated circuit as claimed in claim 8 wherein the single metallic barrier layer contains a metal selected from a group consisting of a lanthanide series element, hafnium, zirconium, yttrium, calcium, strontium, barium, and a combination thereof.

14. The integrated circuit as claimed in claim 8 wherein the conductor core contains a metal selected from a group consisting of copper, copper-base alloys, gold, gold-base alloys, silver, silver-base alloys, and combinations thereof.

15. The integrated circuit as claimed in claim 8 including a seed layer disposed between the single barrier layer and the conductor core, the seed layer containing a metal selected from a group consisting of copper, copper-base alloys, gold, gold-base alloys, silver, silver-base alloys, and combinations thereof forming a stable intermetallic compound with the metallic barrier layer.

16. The integrated circuit as claimed in claim 8 wherein the single metallic barrier layer is of a thickness between 10 Å to 100 Å.

17. An integrated circuit having a silicon substrate having a semiconductor device provided thereon, comprising:
   a device dielectric layer of silicon oxide formed on the silicon substrate;
   a channel dielectric layer of silicon oxide formed on the device silicon oxide layer having a channel opening provided therein;
   a copper conductor filling the channel opening and connected to the semiconductor device; and
   a single barrier layer of copper conductor material having a barrier metal spread throughout the copper conductor material, the single barrier layer lining the channel opening under the copper conductor, the single barrier layer having the barrier metal forming a metal oxide having a more negative heat of formation than silicon oxide whereby the barrier metal of the single barrier layer forms with the silicon oxide of the channel dielectric layer, the metal oxide as a barrier to diffusion of copper from the copper conductor to the channel dielectric layer and the barrier metal of the single barrier layer forms a stable intermetallic compound with copper.

18. The integrated circuit as claimed in claim 17 including:
   a via dielectric layer of silicon oxide formed over the channel dielectric layer and having a via opening provided therein open to the copper conductor;
   second channel dielectric layer of silicon oxide formed over the via dielectric layer and having a second channel opening provided therein open to the via opening;
   a second copper conductor filling the via and second channel openings; and
   a second barrier layer lining the via and second channel openings under the second copper conductor, the second barrier layer having a barrier metal forming a metal oxide whereby the barrier metal of the second barrier layer reduces the silicon oxide of the via and second dielectric layers to form the metal oxide as a barrier to diffusion of copper from the second copper conductor to the via and second channel dielectric layers, the barrier metal of the second barrier layer forming a stable intermetallic compound with copper and not forming a barrier between the copper conductor and the second copper conductor, and the single barrier layer and the second barrier layer is a material selected from a group consisting of a lanthanide series element, hafnium, zirconium, yttrium, calcium, strontium, barium, and a combination thereof.

19. The integrated circuit as claimed in claim 17 wherein the single barrier layer is of a thickness between 10 Å to 100 Å.

* * * * *